United States Patent [19]

Lee

[11] Patent Number: 5,446,297
[45] Date of Patent: Aug. 29, 1995

[54] CCD TYPE SOLID-STATE IMAGE SENSOR

[75] Inventor: Seo K. Lee, Kyungki-do, Rep. of Korea

[73] Assignee: Goldstar Electron Co., Ltd., Rep. of Korea

[21] Appl. No.: 193,294

[22] Filed: Feb. 8, 1994

[30] Foreign Application Priority Data

Dec. 13, 1993 [KR] Rep. of Korea .............. 27491/1993

[51] Int. Cl.⁶ .................. H01L 29/796; H01L 27/14; H01L 31/00
[52] U.S. Cl. ...................... 257/223; 257/233
[58] Field of Search ............ 257/222, 223, 229, 230, 257/232, 233

[56] References Cited

U.S. PATENT DOCUMENTS

| | | | |
|---|---|---|---|
| 4,498,013 | 2/1985 | Kuroda et al. | 257/223 |
| 4,851,890 | 7/1989 | Miyatake | 257/223 |
| 4,951,104 | 8/1990 | Kato et al. | 257/30 |
| 5,132,762 | 7/1992 | Yamada | 257/222 |
| 5,181,093 | 1/1993 | Kawaura | 257/223 |
| 5,191,399 | 3/1993 | Maegawa et al. | 257/223 |
| 5,233,429 | 8/1993 | Jung | 257/223 |

Primary Examiner—Gene M. Munson
Attorney, Agent, or Firm—Poms, Smith, Lande & Rose

[57] ABSTRACT

A CCD type solid-state image sensor a n type silicon substrate, a first p type well formed over the substrate, photodiode regions deeply and widely formed in the first well, second p type wells formed in the first well, each of the second well being overlapped with each corresponding photodiode region and each photodiode region preceding to the corresponding photodiode region, n type VCCD channel regions respectively formed in the second wells, p type transfer gate channel regions each formed in each one of the second p type wells between each photodiode region and each corresponding VCCD channel region, p type channel stop regions respectively formed in the second wells, each of the channel stop regions being adapted to isolate each corresponding VCCD channel region from each corresponding preceding photodiode region, p type impurity regions respectively formed beneath surfaces of the photodiode regions, a thin insulating film formed over the entire exposed surface of the resulting structure, transfer gates formed on the thin insulating film to be respectively disposed over the second wells, an interlayer insulating film formed on the thin insulating film to cover the transfer gate electrodes, and a photoshield film formed over the entire exposed surface of the resulting structure except for portions respectively disposed over the photodiode regions.

11 Claims, 9 Drawing Sheets

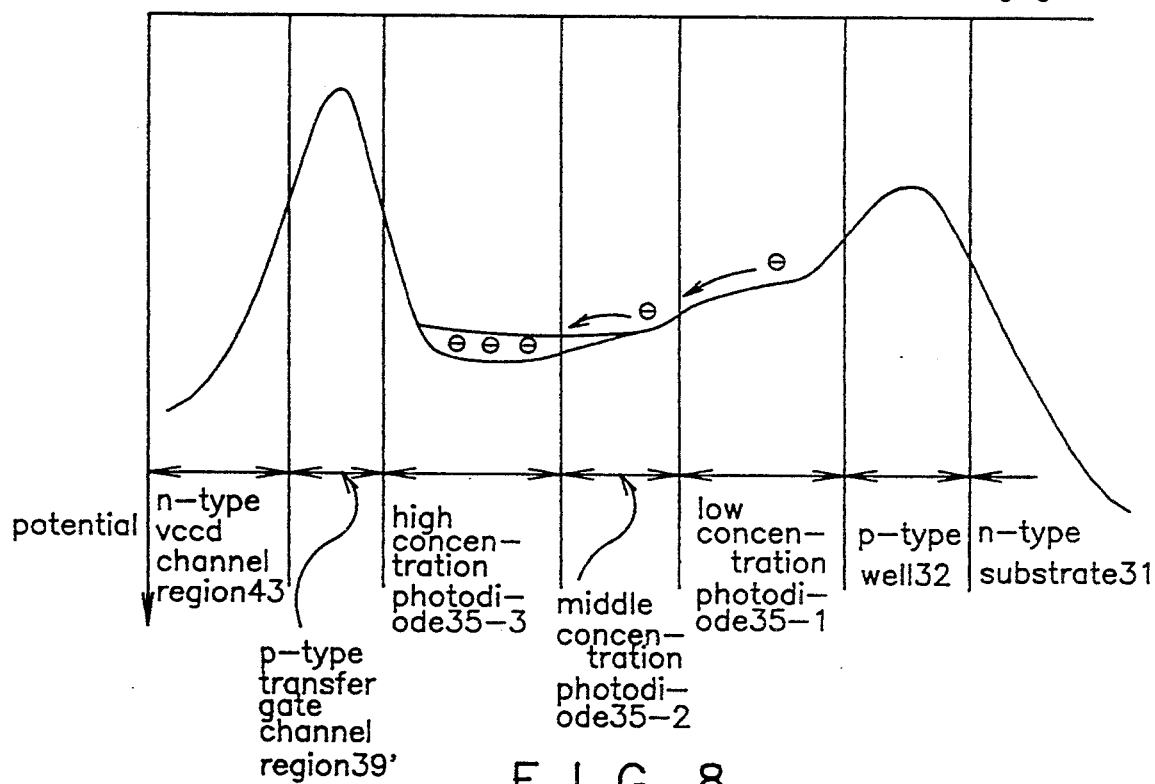
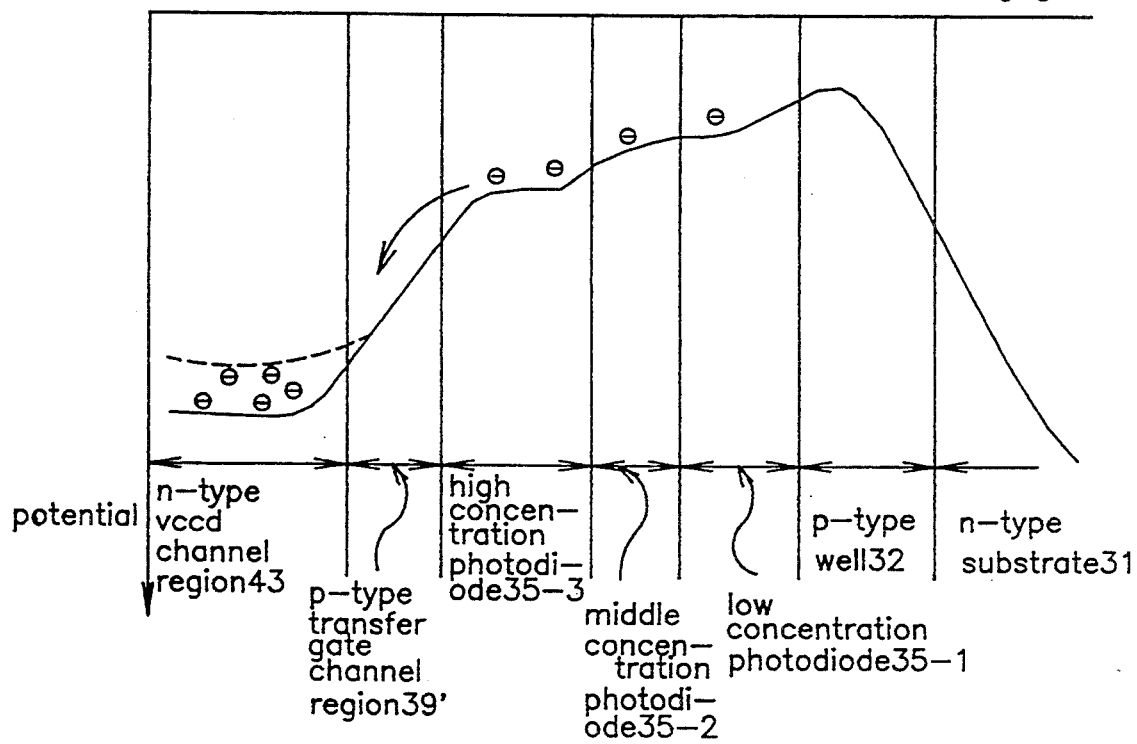

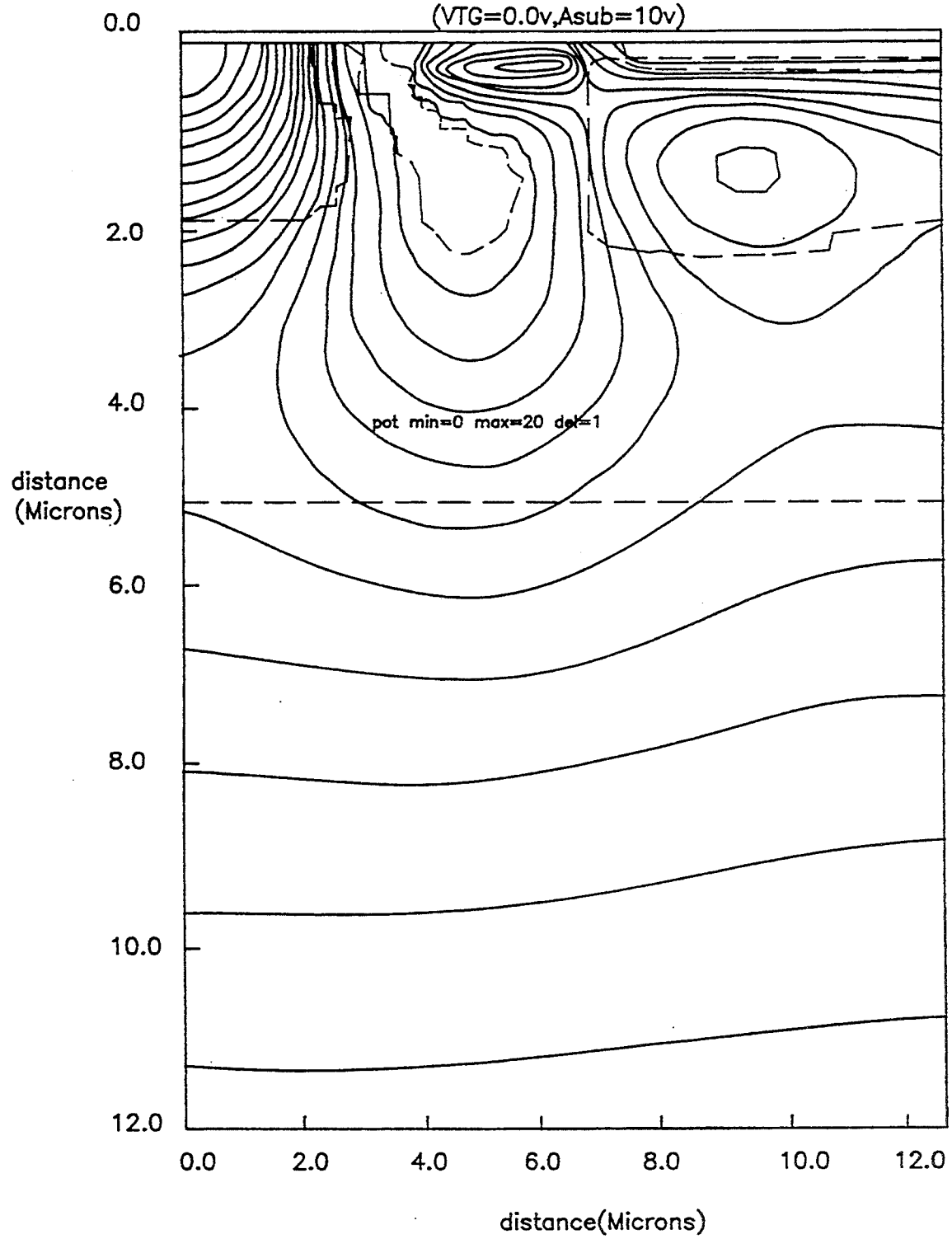

CCD TYPE SOLID-STATE IMAGE SENSOR

BACKGROUND OF THE INVENTION

The present invention relates to a CCD type solid-state image sensor, and more particularly to a solid-state image sensor having a buried transfer gate channel region and a rivet type photodiode region with a stepwise concentration distribution.

FIG. 1 is a sectional view of a conventional interlaced CCD type solid-state image sensor.

As shown in FIG. 1, the conventional solid-state image sensor comprises a n type substrate 11, a p type well 12 formed in the n type substrate 11, a plurality of n type photodiode regions 13 formed in the p type well 12 by an implantation of n type impurity ions to have a depth of 0.5 to 0.7 μm, and a p+ type layer 14 of a high concentration formed over each n type photodiode 13 to have a depth of 0.1 to 0.2 μm so as to reduce a surface noise of the n type photodiode 13. The solid-state image sensor further comprises a plurality of n type vertical CCD (VCCD) channel regions 15 each formed in the p type well 12 to a depth of 0.3 to 0.7 μm to be spaced from each corresponding n type photodiode region 13 and adapted to serve as a vertical transfer channel for a signal transfer, a p− type transfer gate channel region 16 formed in the p type well 12 between each n type VCCD channel region 15 and each corresponding n type photodiode region 13, a p type channel stop region 17 formed in the p type well 12 between each n type photodiode region 13 and each n type VCCD channel region 15 neighboring to the n type photodiode region 13, a thin insulating film 18 formed over the n type substrate 11, a transfer gate 19 formed on the insulating film 18 over each p− type transfer gate channel region 16 and each n type VCCD channel region 15 and made of a polysilicon film doped with n type impurity ions, a photoshield metal film 21 formed over the entire surface of the resulting structure except for a region disposed above each n type photodiode region 13 to form an opening 22 through which light beams enter the n type photodiode region 13, and an interface insulating film 20 for insulating the transfer gate 19 from the photoshield metal film 21.

The conventional interlaced CCD type solid-state image sensor having the above-mentioned structure operates in an integration mode for accumulating signal charges generated from each n type photodiode region 13 by light beams introduced through each corresponding opening 22 or in a read-out mode for transferring the signal charges accumulated in the n type photodiode region 13 to the corresponding n type VCCD channel region 15.

The integration mode operation is the operation for collecting signal charges for a predetermined time. Potential distribution for various parts of the solid-state image sensor in the integration mode is shown in FIG. 2 which is taken along the line A-A' of FIG. 1. Due to a potential barrier formed by each p− type transfer gate channel region 16 and the p type well 12, the signal charges generated by the incident light beams are accumulated in each corresponding n type photodiode region 13 for a predetermined time of, for example, 1/60 to 1/30 second.

In the integration mode, a voltage of 0 V is applied to the transfer gate 19. As a result, each p− type transfer gate channel region 16 forms surely a potential barrier for preventing the charges accumulated in each corresponding n type photodiode region 13 from being moved, as shown in FIG. 2.

On the other hand, the read-out mode operation is the operation for transferring the signal charges accumulated in each n type photodiode region 13 to each corresponding n type VCCD channel region 15. Potential distribution for various parts of the solid-state image sensor in the read-out mode is shown in FIG. 3 which is taken along the line A-A' of FIG. 1 and in FIG. 4 which is taken along the line B-B' of FIG. 1.

In the read-out mode, a voltage of 15 V is applied to the transfer gate 19. As a result, the potential of each n type VCCD channel region 15 becomes very low, as shown in FIGS. 3 and 4. Also, the potential of each p− type transfer gate channel region 16 becomes low. Accordingly, the signal charges accumulated in each photodiode region 13 move to each corresponding n type VCCD channel region 15 through each corresponding p− type transfer gate channel region 16. Thus the signal charges can be read out.

However, the conventional solid-state image sensor has a drawback that the surface area of each transfer gate 19 should be large because the signal charges accumulated in each photodiode region 13 move to each corresponding n type VCCD channel region 15 through each corresponding p− type transfer gate channel region 16. In the conventional solid-state image sensor, the probability that noise charges are included in the signal charges transferred to the VCCD channel regions 15 is adversely increased.

Since the junction depth of each photodiode region 13 is small, the sensitivity characteristic of the solid-state image sensor is poor. This poor sensitivity characteristic results in a poor smear characteristic.

Where each photodiode region 13 has a large width, the image lag characteristic of the solid-state image sensor is poor because effect of a fringing field is small even though each transfer gate 19 is turned on.

Moreover, when strong light beams enter photodiodes 13 through openings 22, charge paths for guiding excessive charges to the substrate 11 become narrower. As a result, the blooming characteristic is degraded.

FIG. 5 is a sectional view of another conventional solid-state image sensor having a double well structure exhibiting an improved blooming characteristic. As shown in FIG. 5, a second p type well 23 is formed beneath each n type VCCD channel region 15. The formation of the second p type well 23 is achieved by implanting p type impurity ions in a portion of the p type well 12 disposed beneath each n type VCCD channel region 15 by use of the high energy ion implantation process.

This conventional solid-state image sensor is disclosed in ITEJ Technical Report Vol 16, No. 18, pp 7-12, IPU 92.8-92.9 (Feb, 1992).

Although the conventional solid-state image sensor having the double well structure improves the blooming characteristic over the case of FIG. 1, it can not solve the problem caused by the signal charge movement through the photodiode regions having the small junction depth and the transfer gate channel regions, as in the case of FIG. 1.

SUMMARY OF THE INVENTION

Therefore, an object of the invention is to solve the above-mentioned problems encountered in the prior arts and to provide a CCD type solid-state image sensor exhibiting improvements in sensitivity, signal lag characteristic, smear and noise characteristic and defect characteristic generated in fabrication.

In accordance with the present invention, this object can be accomplished by providing a CCD type solid-state image sensor comprising: a silicon substrate of a first conductivity type; a first well of a second conductivity type formed over said silicon substrate; a plurality of photodiode regions deeply and widely formed in said first well to be uniformly spaced from one another; a plurality of second wells of the second conductivity type formed in the first well, each of said second well being overlapped with each corresponding one of said photodiode regions and one of said photodiode regions preceding to said corresponding photodiode region; a plurality of vertical CCD channel regions of the first conductivity type respectively formed in the second wells; a plurality of transfer gate channel regions of the second conductivity type each formed in each one of the second p type wells between each photodiode region and each corresponding VCCD channel region; a plurality of channel stop regions of the second conductivity type respectively formed in the second wells, each of said channel stop regions being adapted to isolate each corresponding VCCD channel region from each corresponding preceding photodiode region; a plurality of impurity regions of the second conductivity type respectively formed beneath surfaces of the photodiode regions; a thin insulating film formed over the entire exposed surface of the resulting structure; a plurality of transfer gates formed on said thin insulating film to be respectively disposed over the second wells; an interlayer insulating film formed on the thin insulating film to cover said transfer gate electrodes; and a photoshield film formed over the entire exposed surface of the resulting structure except for portions respectively disposed over the photodiode regions.

BRIEF DESCRIPTION OF THE DRAWINGS

Other objects and aspects of the invention will become apparent from the following description of embodiments with reference to the accompanying drawings in which:

FIG. 7 is a potential distribution diagram taken along the line C-C' of FIG. 6 in an integration mode operation;

FIG. 8 is a potential distribution diagram taken along the line C-C' of FIG. 1 in a read-out mode operation;

FIG. 9 is a diagram illustrating a simulated potential distribution between a photodiode region and a VCCD channel region of the solid-state image sensor in accordance with the present invention when a transfer gate is turned off;

FIG. 10 is a diagram illustrating a simulated potential distribution between a photodiode region and a VCCD channel region of the solid-state image sensor in accordance with the present invention when a transfer gate is turned on.

DETAILED DESCRIPTION OF THE PREFERRED EMBODIMENTS

Figure 1:
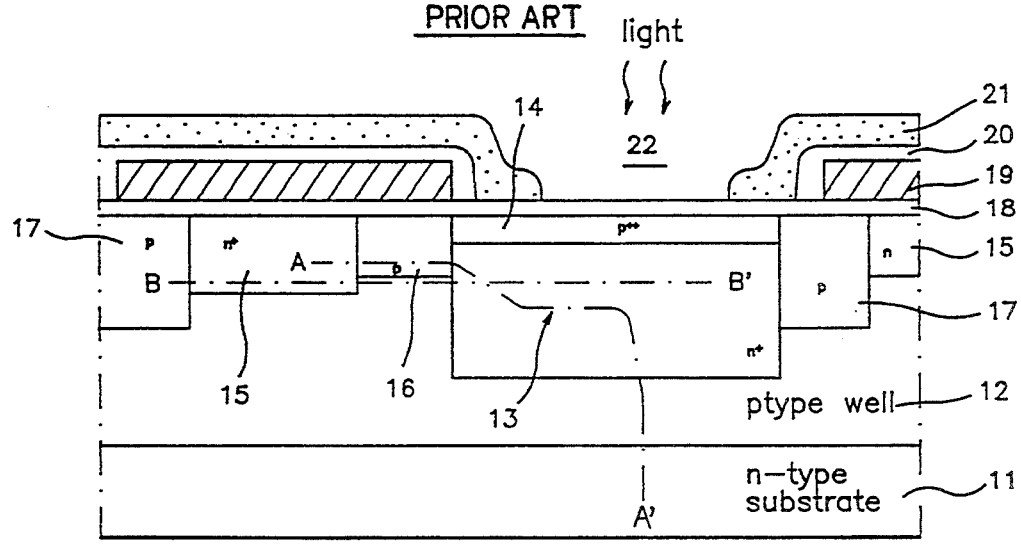
FIG. 1 is a sectional view of a conventional interlaced CCD type solid-state image sensor.
Figure 2:
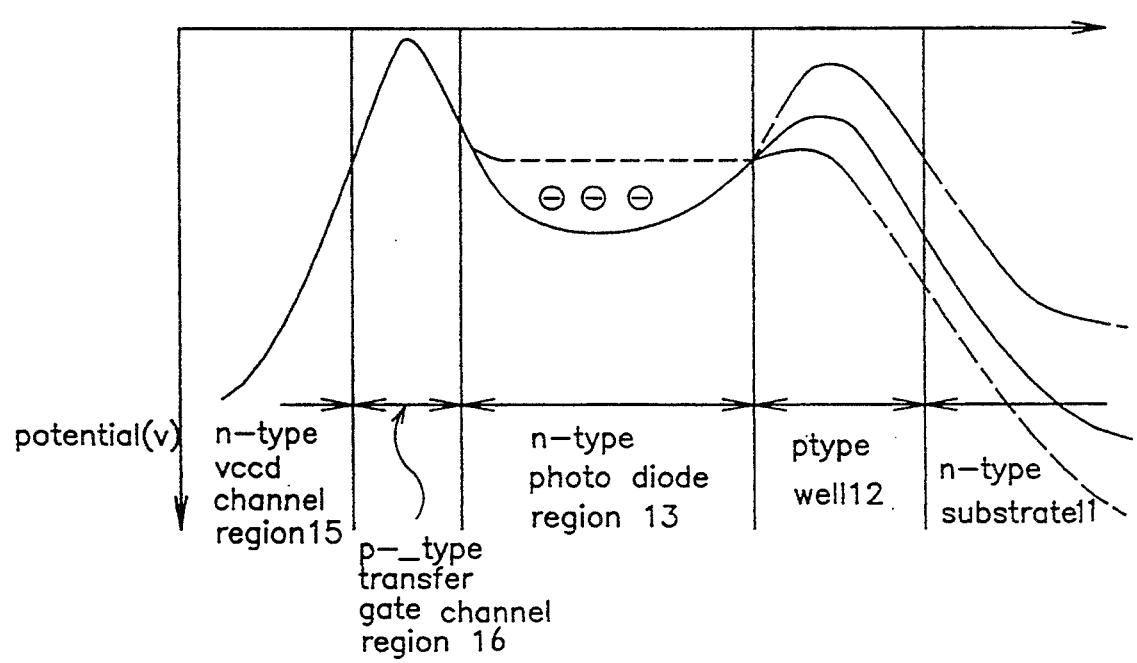
FIG. 2 is a potential distribution diagram taken along the line A-A' of FIG. 1 in an integration mode operation.
Figure 3:
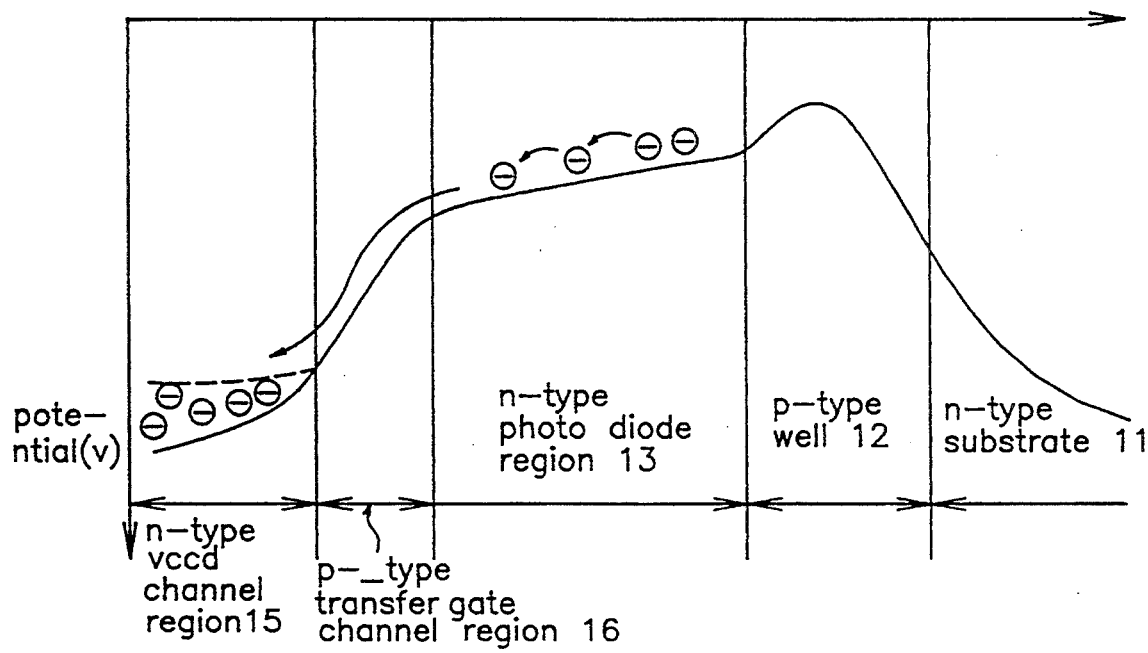
FIG. 3 is a potential distribution diagram taken along the line A-A' of FIG. 1 in a read-out mode operation.
Figure 4:
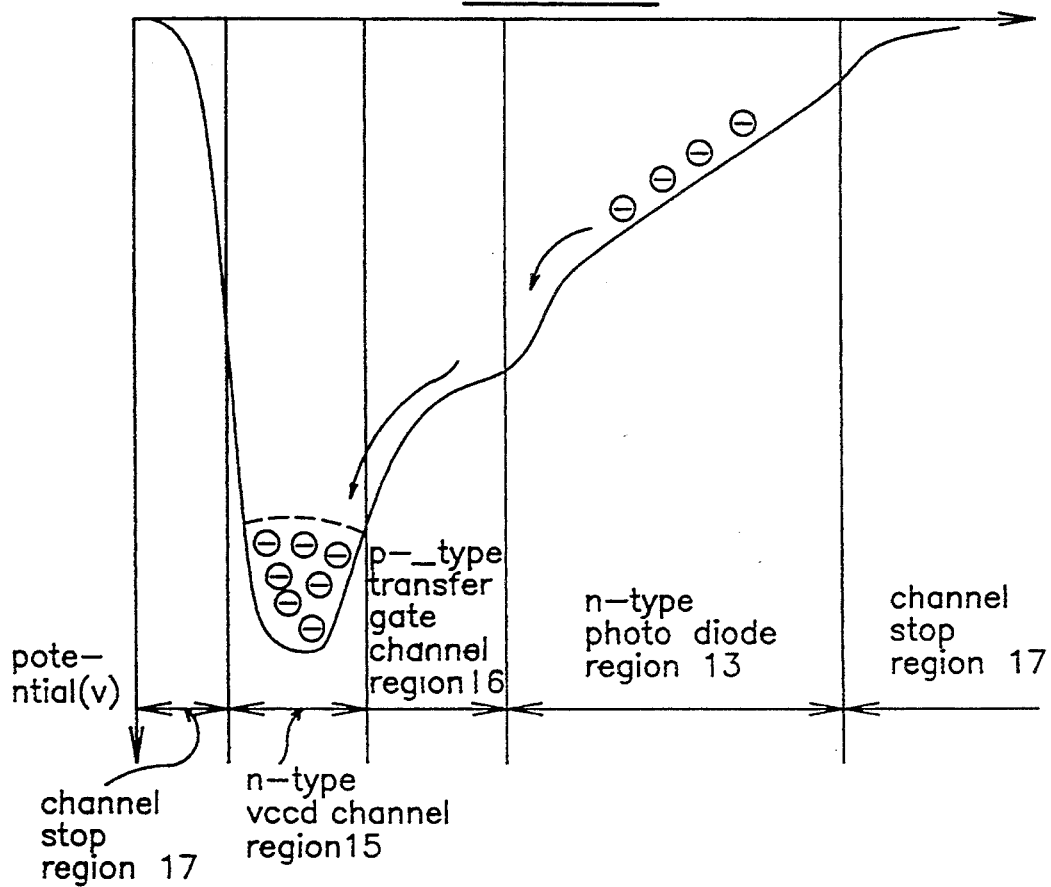
FIG. 4 is a potential distribution diagram taken along the line B-B' of FIG. 1 in a read-out mode operation.
Figure 5:
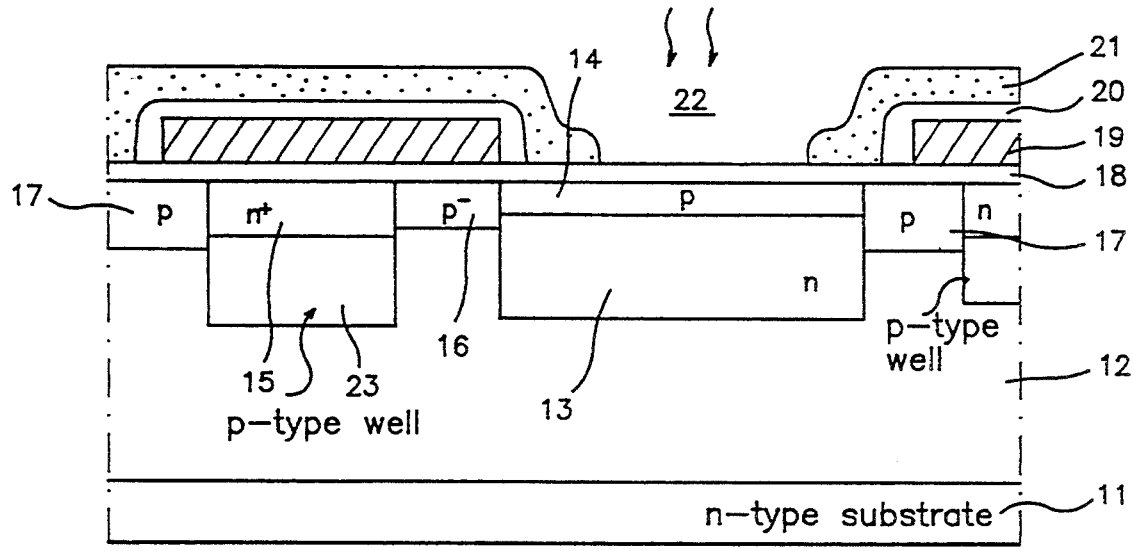
FIG. 5 is a sectional view of another conventional solid-image state sensor exhibiting an improved blooming characteristic.
Figure 6:
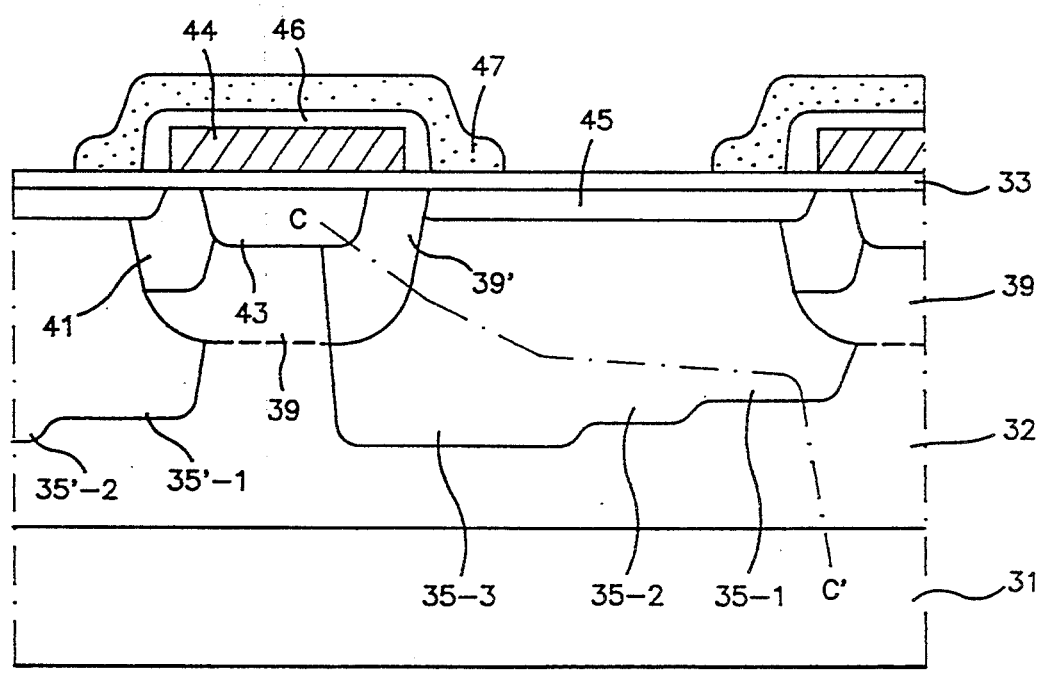
FIG. 6 is a sectional view of a CCD type solid-state image sensor in accordance with the present invention.

FIG. 6 is a sectional view of a CCD type solid-state image sensor in accordance with the present invention.

As shown in FIG. 6, the CCD type solid-state image sensor comprises a n type substrate 31, a p type well 32 formed in the n type substrate 31, and a plurality of n type photodiode regions 35. In FIG. 6, only one of the n type photodiode regions 35 is shown.

Each n type photodiode region 35 is constituted by a relatively low concentration photodiode 35-1, a middle concentration photodiode 35-2, and a relatively high concentration photodiode 35-3. In other word, the n type photodiode region 35 has a concentration distribution in which the impurity concentration is not uniform throughout the n type photodiode region 35, but gradually reduced away from a VCCD channel region 43 which will be described hereinafter.

Over each n type photodiode region 35, a $p^{++}$ layer 45 of a high concentration is formed which serves to reduce a surface noise of the n type photodiode region 35.

The CCD type solid-state image sensor further comprises a second p type well 39 formed between neighboring n type photodiode regions 35, in particular, between the high concentration photodiode 35-3 of one n type photodiode region 35 and the low concentration photodiode 35'-1 of the other n type photodiode region 35' preceding to the one n type photodiode region 35 such that it overlaps with the photodiodes 35-3 and 35'-1. Formed in the second p type well 39 are the n type VCCD channel region 43, a p type transfer gate channel region 39' and a p type channel stop region 41.

The p type channel stop region 41 serves to isolate the low concentration photodiode 35'-1 of the preceding n type photodiode region 35' from the n type VCCD channel region 43.

The p type transfer gate channel region 39' is formed between the high concentration photodiode 35-3 of the n type photodiode region 35 and the n type VCCD channel region 43.

A thin insulating film 33 such as an oxide film is formed over the entire upper surface of the substrate 31. On the insulating film 33, a transfer gate 44 is formed to extend over the p type channel stop region 41, the n type VCCD channel region 43, and the p type transfer gate channel region 39'. A photoshield layer 47 made of an appropriate metal is formed over the entire surface of the resulting structure except for a region disposed above each n type photodiode region 35. Between the photoshield layer 47 and the transfer gate 44, an interface insulating film 46 is formed so as to insulate the transfer gate 44 from the photoshield layer 47.

In the solid-state image sensor having the abovementioned structure, the second p type well 39 and the $p^{++}$ type layer 45 have higher impurity ion concentrations than that of the corresponding photodiode region 35, respectively. On the other hand, the p type transfer gate channel region 39' has a lower impurity ion concentration than that of the channel stop region 41 while the photodiode region 35 has a higher concentration than that of the first p type well 32.

Operations of the CCD type solid-state image sensor having the above-mentioned structure will now be described, in conjunction with FIGS. 7 and 8.

First, an integration mode operation of the CCD type solid-state image sensor will be described, in conjunction with FIG. 7 illustrating a potential distribution along the line C-C' of FIG. 6.

In the integration mode, each photodiode region 35 has different pinch-off potentials at all portions thereof, respectively, because it has a concentration distribution in which impurity ion concentrations at the portions of the photodiode region 35 are different, as shown in FIG. 7. As a result, the transfer gate channel region 39' has a peak potential value deeply formed toward a bulk to a depth of, for example, 1.2 to 1.7 μm. This makes it possible to obtain a superior strength characteristic in the red light wavelength band.

Since the photodiode region 35 has the stepwise varying potential distribution, a small quantity of charges are moved toward and accumulated in the highest concentration photodiode 35-3 of the photodiode region 35 first. Accordingly, the charges can be easily read out toward the VCCD channel region 35 when the transfer gate 44 is turned on.

Now, a read-out mode operation of the CCD type solid-state image sensor will be described.

As the transfer gate 39 is turned on by a voltage of about 15 V applied thereto, the solid-state image sensor has a potential distribution as shown in FIG. 8. At this time, charges accumulated in the n type photodiode region 35 are moved toward the n type VCCD channel region 43 through the transfer gate channel region 39' disposed toward the bulk and then read out.

Since the accumulated signal charges are not moved toward the surface of the transfer gate channel region 39' but moved toward the bulk by virtue of the presence of the second p type well 39 of the high concentration, the read-out of the signal charges can be accomplished without being affected by any noise. As a result, the signal lag characteristic of the solid-state image sensor is good.

Even though excessive charges are present in the photodiode region 35, a side diffusion effect by the excessive charges is low by virtue of the fact that the photodiode region 35 of the solid-state image sensor of the present invention is wide and deep so as to provide a wider charge path for guiding the excessive charges to the n type substrate 31, as compared to the conventional structure. Accordingly, an improvement in anti-blooming characteristic is obtained.

Figure 10:
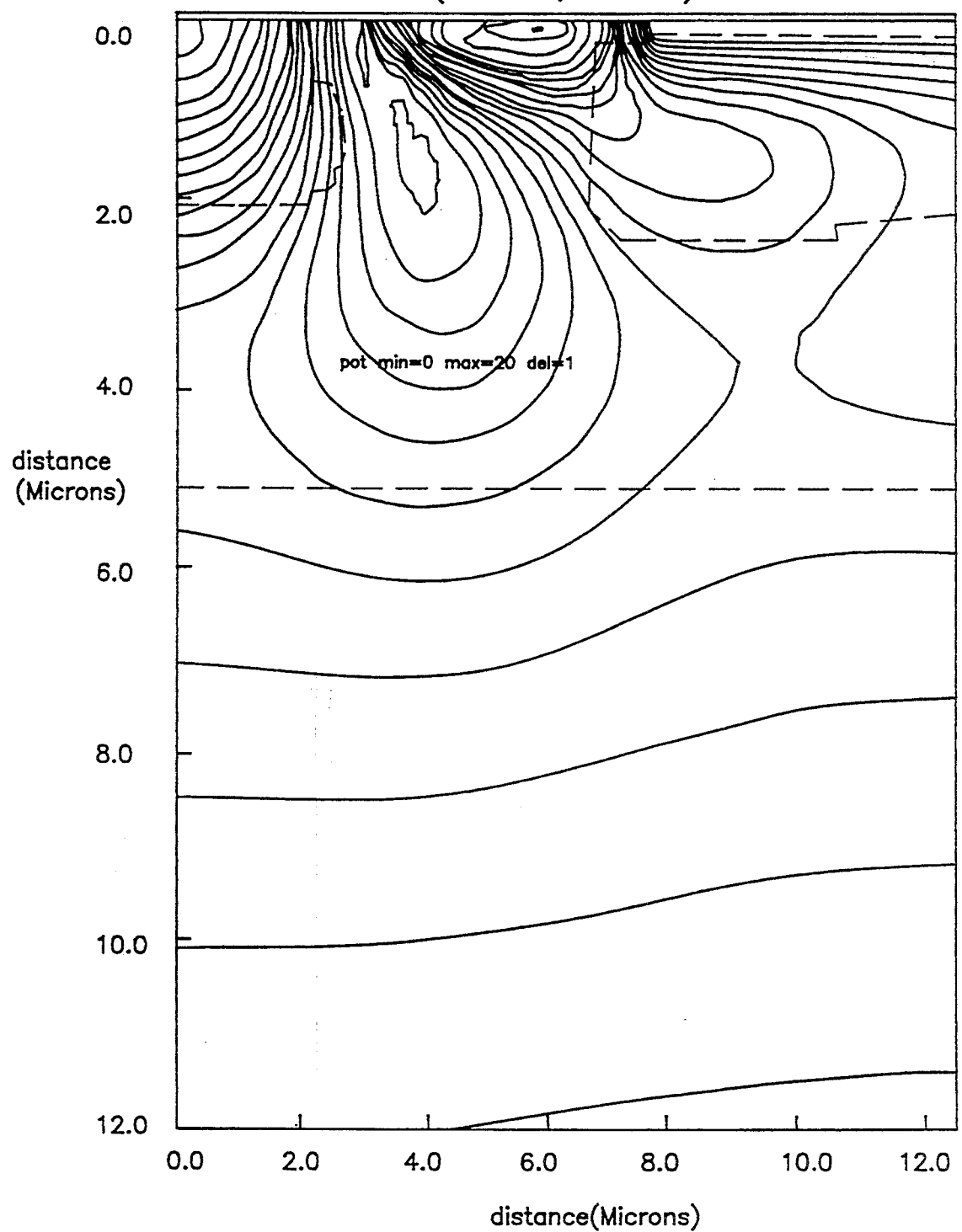

FIGS. 9 and 10 illustrate simulated potential distributions of the photodiode region 35 and the VCCD channel region 43 of the solid-state image sensor in accordance with the present invention, respectively. FIG. 9 is a potential distribution diagram in a case when the transfer gate 44 is turned off by a voltage of 0 V applied thereto. On the other hand, FIG. 10 is a potential distribution diagram in a case when the transfer gate 44 is turned on by a voltage of 15 V applied thereto.

FIGS. 11A to 11I are sectional views respectively illustrating a method for fabricating a solid-state image sensor in accordance with the present invention. In FIGS. 11A to 11I, elements corresponding to those in FIG. 6 are denoted by the same reference numerals.

Figure 11A:
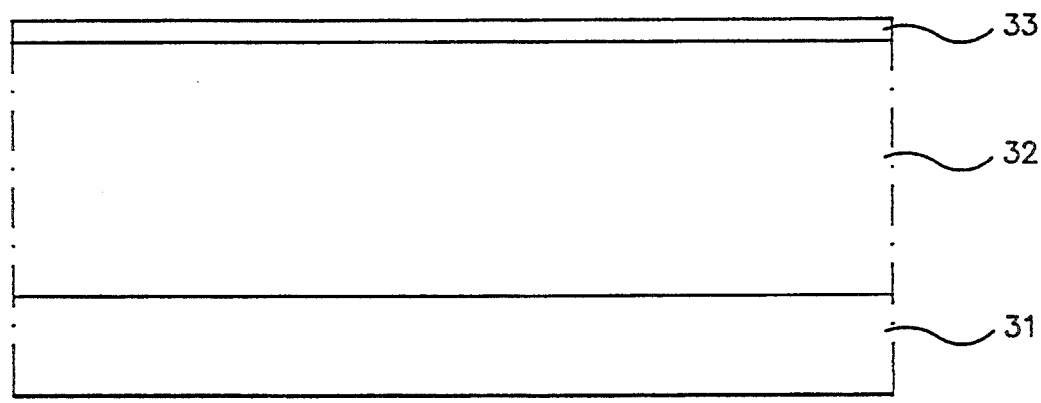
FIGS. 11A to 11I are sectional views respectively illustrating a method for fabricating the CCD type solid-state image sensor of FIG. 6.

First, a first p type well 32 is formed to a thickness of 3 to 6 μm over a n type silicon substrate 31, as shown in FIG. 11A. The formation of the first p type well 32 is achieved by forming a p type epitaxial layer over the n type silicon substrate 31 or implanting p type impurity ions in the n type silicon substrate 31 and then thermally diffusing the implanted impurity ions.

The n type silicon substrate 31 has a resistance of 10 to 100 Ω.cm.

Thereafter, an oxide film 33 having a small thickness is formed as an insulating film over the first p type well 32. As the insulating film, a nitride film may be used in place of the oxide film.

Figure 11B:
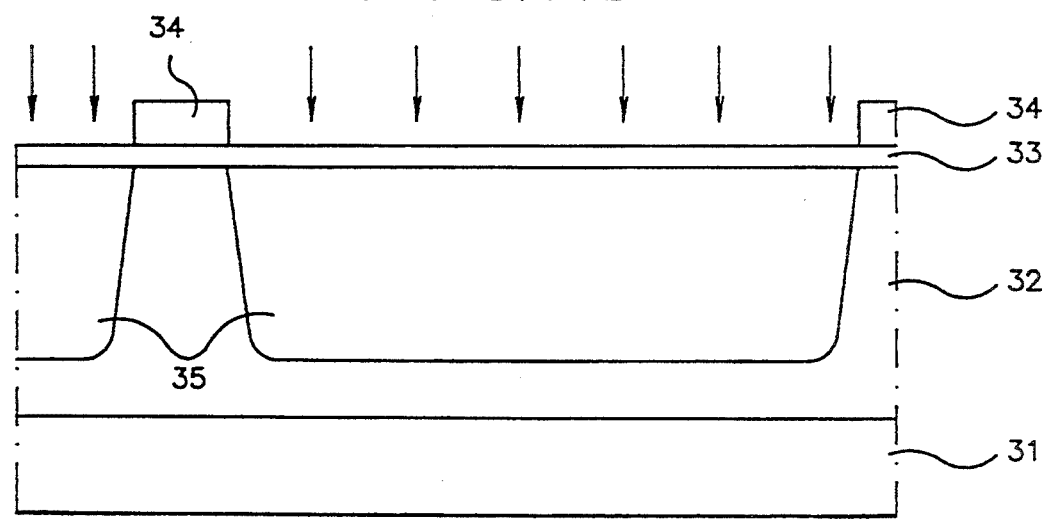
Figure 11C:
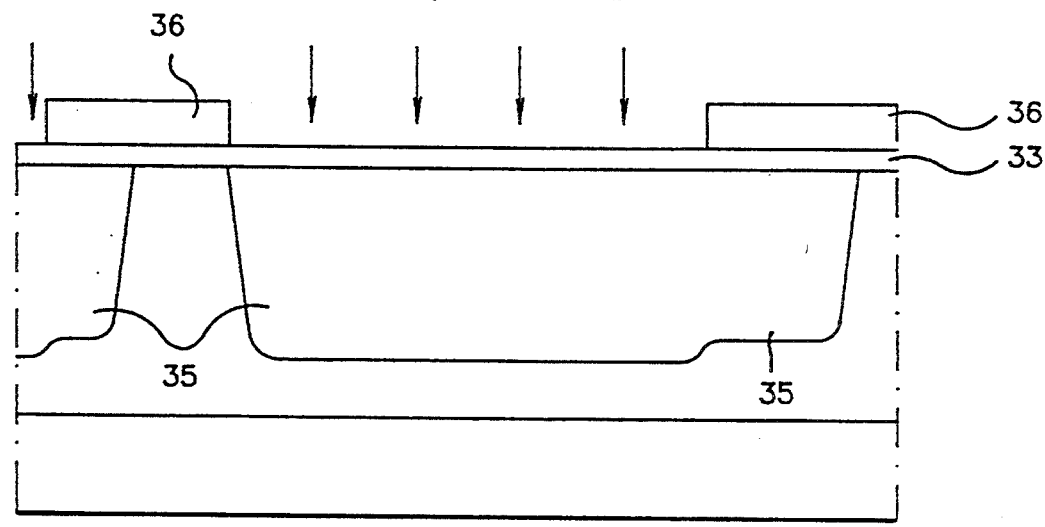
Figure 11D:
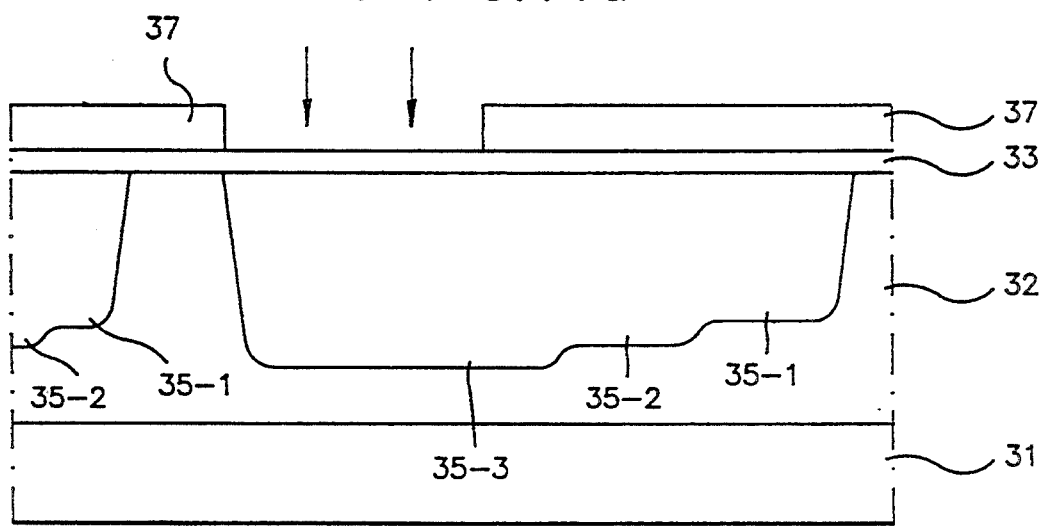

FIGS. 11B to 11D are sectional views respectively illustrating a formation of n type photodiodes 35.

As shown in FIG. 11B, a photoresist film 34 is coated over the oxide film 33 and then patterned to exposed portions of the oxide film 33 on which photodiodes will be formed, respectively. Thereafter, n type impurity ions are implanted in the first p type well 32 through the exposed portions of the oxide film 33 to form n type photodiodes 35-1 of a relatively low concentration.

The remaining photoresist film 34 is then removed, as shown in FIG. 11C. Over the entire exposed surface of the resulting structure, a photoresist film 36 is coated. The photoresist film 36 is then patterned to partially expose the oxide film 33 at its portions respectively disposed over the low concentration n type photodiodes 35-1.

Through the exposed portions of the oxide film 33, n type impurity ions are implanted in the low concentration n type photodiodes 35-1, thereby respectively forming n type photodiodes 35-2 having a middle concentration relatively higher than that of the low concentration n type photodiodes 35-1.

As shown in FIG. 11D, the remaining photoresist film 36 is then removed. Over the entire exposed surface of the resulting structure, a photodiode film 37 is coated. The photoresist film 37 is then patterned to partially expose the oxide film 33 at its portions respectively disposed over the middle concentration n type photodiodes 35-2.

Through the exposed portions of the oxide film 33, n type impurity ions are implanted in the middle concentration n type photodiodes 35-2, thereby respectively forming n type photodiodes 35-2 having a high concentration relatively higher than that of the middle concentration n type photodiodes 35-2.

Thus each of n type photodiode regions 35 has a concentration distribution stepwise varying along all portions thereof. As mentioned above, this can be achieved by implanting n type impurity ions in each n type photodiode region 35 in different concentrations corresponding the portions of the n type photodiode region 35 by use of selective photoetching processes and then thermally diffusing the implanted n type impurity ions.

Each photodiode region 35 has a junction depth of 1.5 to 3.5 μm and an impurity ion concentration higher than that of the first p type well 32.

Figure 11E:
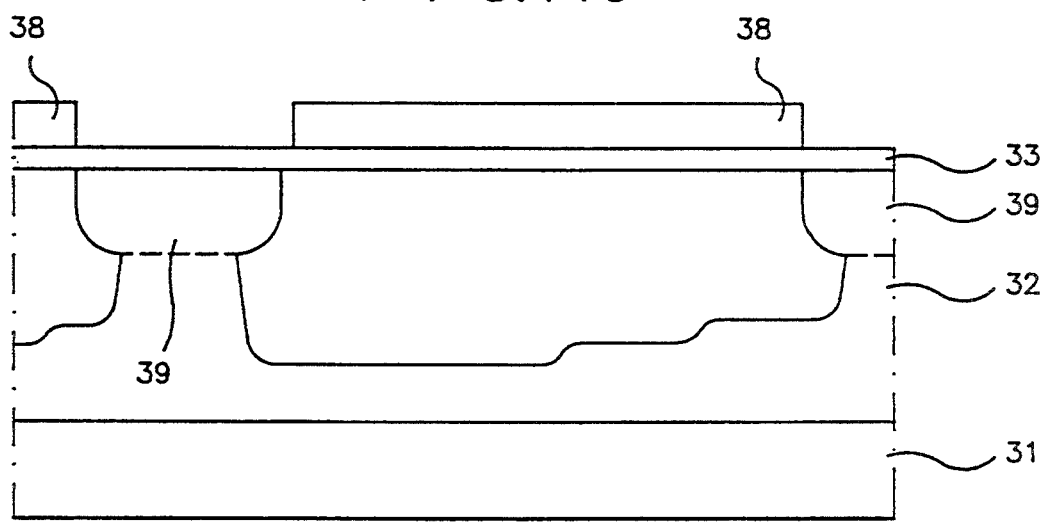

Subsequently, the remaining photoresist film 37 is removed. Over the entire exposed surface of the resulting structure, another photodiode film 38 is coated, as shown in FIG. 11E. The photoresist film 38 is then patterned to partially expose the oxide film 33 at its portions each including a portion disposed between adjacent photodiode regions 35 and portions disposed on facing lateral ends of the adjacent photodiode regions 35.

Through the exposed portions of the oxide film 33, p type impurity ions of a high concentration are implanted, thereby respectively forming second p type wells 39.

Each of the second p type well 39 is disposed between the high concentration n type photodiode 35-3 of each corresponding photodiode region 35 and the low concentration n type photodiode 35'-1 of the photodiode region 35' adjacent to the photodiode region 35 such that it is overlapped with the photodiodes 35-3 and 35'-1.

Each second p type well 39 has a higher impurity concentration than that of first wells 32 and a depth of about 1.0 to 1.5 μm from the oxide film 3.

Figure 11F:
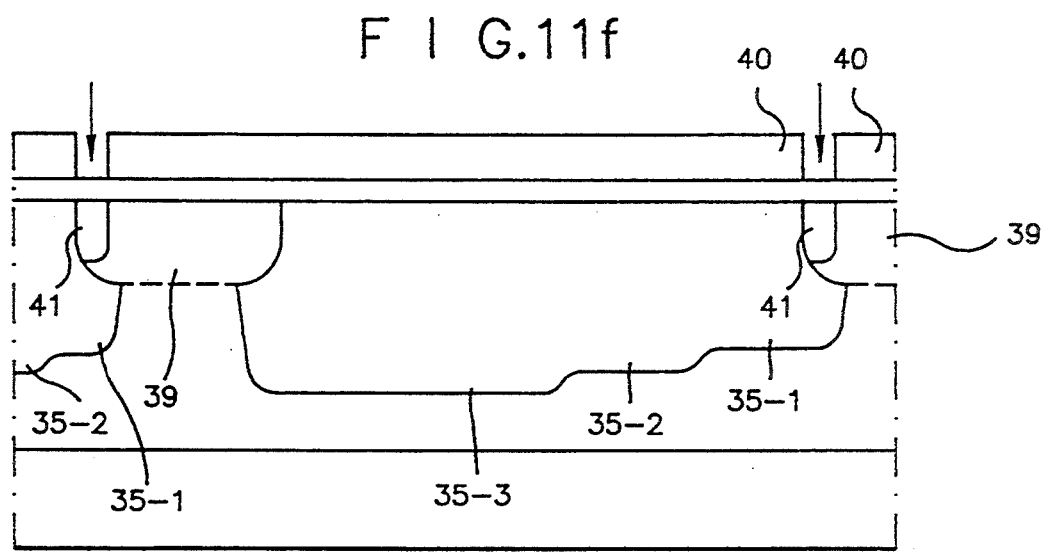

Then, the remaining photoresist film 38 is removed. Over the entire exposed surface of the resulting structure, another photodiode film 40 is coated, as shown in FIG. 11F. The photoresist film 40 is then patterned to partially expose the oxide film 33 at its portions respectively disposed over portions of the second p type wells 39 overlapped with the low concentration photodiodes 35-1.

Through the exposed portions of the oxide film 33, p type impurity ions are implanted in the second p type wells 39, thereby respectively forming p type channel stop regions 41 of a high concentration in the second p type wells 39.

Figure 11G:
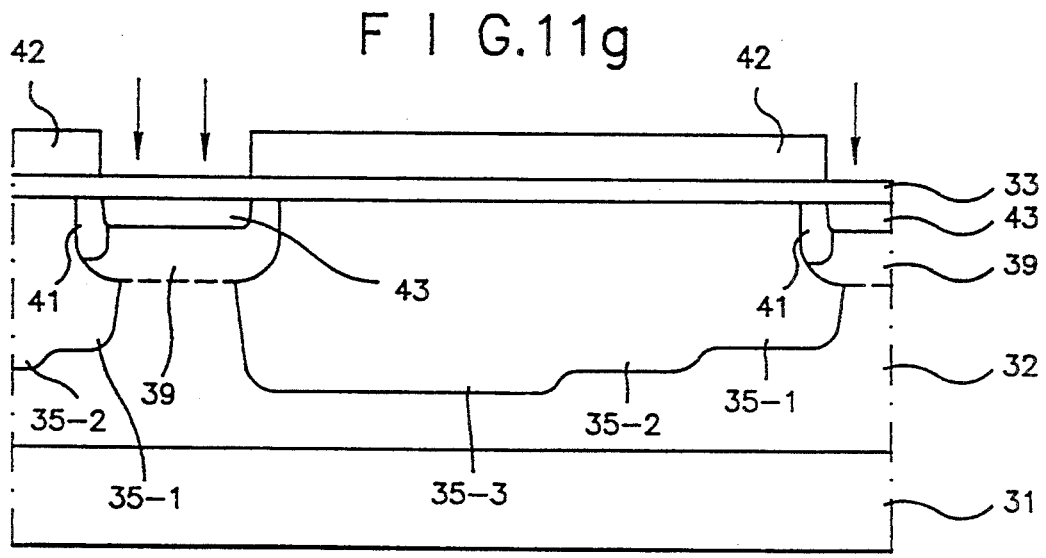

Thereafter, the remaining photoresist film 40 is removed, as shown in FIG. 11G. Over the entire exposed surface of the resulting structure, another photodiode film 42 is coated. The photoresist film 42 is then patterned to partially expose the oxide film 33 at its portions respectively disposed adjacent to the second p type wells 39.

Through the exposed portions of the oxide film 33, n type impurity ions are implanted in the second p type wells 39, thereby respectively forming VCCD channel regions 43 disposed adjacent to the channel stop regions 41 in the second p type wells 39.

Each VCCD channel stop region 41 is isolated from the low concentration photodiode 35'-1 of each preceding photodiode region 35' by each corresponding high concentration p type channel stop region 41. Each VCCD channel stop region 41 has a higher impurity ion concentration than that of the second p type wells 39 and a junction depth of 0.2 to 1.2 μm.

Figure 11H:
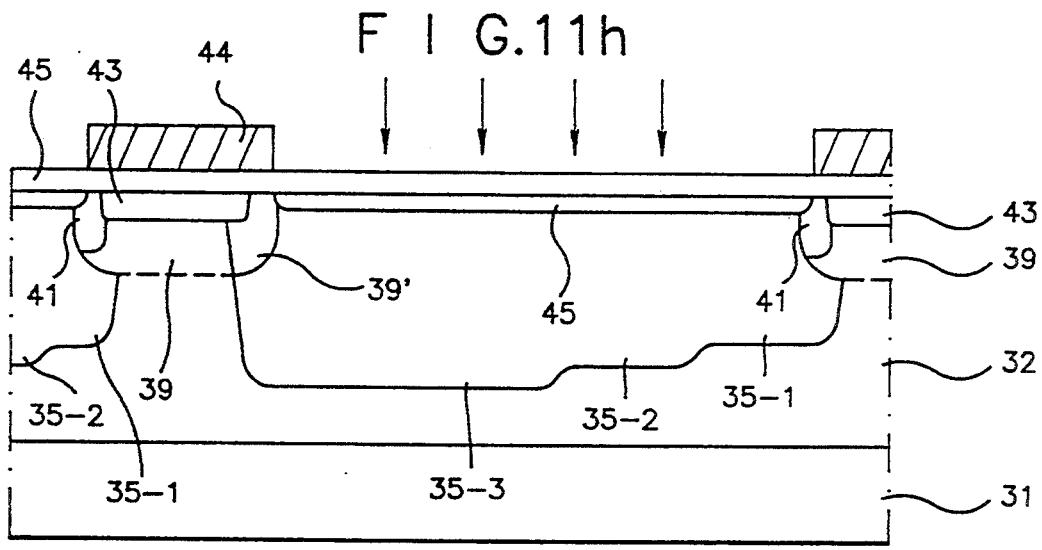

Over the entire exposed surface of the resulting structure, a polysilicon film 44 doped with impurity ions is formed, as shown in FIG. 11H. Then, the polysilicon film 44 is photo-etched to form transfer gate electrodes 44 respectively disposed over the second p type wells 39.

Using the transfer gate electrodes 44 as self-aligned masks, p type impurity ions are implanted in the photodiode regions 35, thereby respectively forming p++ layers 45.

Each of the p++ layers 45 is disposed beneath the surface of each corresponding photodiode region 35. Each p++ layer 45 has a junction depth of 0.1 to 0.2 μm and an impurity ion concentration higher than that of the photodiode regions 35 by 10 to 100 times.

As a result of the ion implantation, a p type buried transfer gate channel region 39' is formed between each VCCD channel region 43 and each corresponding photodiode region 35. The p type buried transfer gate channel region 39' has an impurity ion concentration lower than that of the second p type well 39 because of the count-doping of the VCCD channel region 43 in the second p type well 39 and the count-doping obtained by the side diffusion of the low concentration photodiode 35-1 of the photodiode region 35.

Figure 11I:
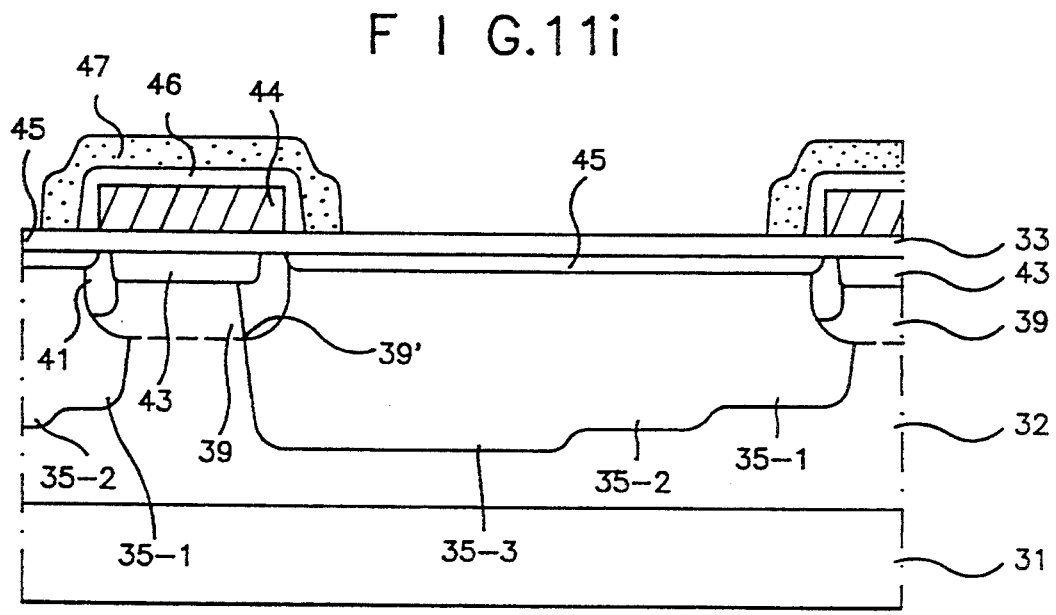

Over the entire exposed surface of the resulting structure, an oxide film is then coated as an interlayer insulating film 46, as shown in FIG. 11I. The interlayer insulating film 46 is then patterned to cover the transfer gate electrodes 44.

Thereafter, a metal layer is deposited over the entire exposed surface of the resulting structure and then patterned to form photoshield films 47 and partially expose the oxide film 33 at its portions respectively disposed over the photodiode regions 35.

Each of the interlayer insulating films 46 serves to insulate each corresponding transfer gate electrode 44 from each corresponding photoshield film 47. The photoshield films 47 serve to shield light beams incident on regions other than the photodiode regions 35.

In accordance with the present invention, the following effects can be obtained.

Since the solid-state image sensor of the present invention has deeper and wider photodiode regions, as compared to the conventional solid-state image sensor, a sensitivity to light of red color wavelength band is improved. Also, the three-dimensional effect caused by the side diffusion can be reduced. This improves the anti-blooming characteristic.

A diffusion smear characteristic can be also improved because the VCCD channel regions as vertical transfer channels are present in the second p type wells having a cup shape, respectively. An improvement in noise characteristic can be achieved because signal charges are moved toward the bulk when the transfer gates are turned on.

In addition, a good image lag characteristic can be obtained in the read-out mode operation because each of n type photodiode regions 35 has a concentration distribution stepwise varying along all portions thereof and most of signal charges are accumulated in the high concentration photodiode of the n type photodiode region disposed nearest to the VCCD channel region.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CCD type solid-state image sensor comprising:
 a silicon substrate of a first conductivity type;
 a first well of a second conductivity type formed over said silicon substrate;
 a plurality of photodiode regions deeply and widely formed in said first well to be uniformly spaced from one another;
 a plurality of second wells of the second conductivity type formed in the first well, each of said second wells having a higher impurity concentration than that of said first well, each of said second wells being overlapped with each corresponding one of said photodiode regions and one of said photodiode regions preceding to said corresponding photodiode region;
 a plurality of vertical CCD channel regions of the first conductivity type respectively formed in said second wells;

a plurality of transfer gate channel regions of the second conductivity type each formed in each one of said second wells between each photodiode region and each corresponding VCCD channel region;

a plurality of channel stop regions of the second conductivity type respectively formed in said second wells, each of said channel stop regions being adapted to isolate each corresponding VCCD channel region from each corresponding preceding photodiode region;

a plurality of impurity regions of the second conductivity type respectively formed beneath surfaces of said photodiode regions;

a thin insulating film formed over the entire exposed surface of the resulting structure;

a plurality of transfer gates formed on said thin insulating film to be respectively disposed over said second wells;

an interlayer insulating film formed on said thin insulating film to cover said transfer gate electrodes; and a photoshield film formed over the entire exposed surface of the resulting structure except for portions respectively disposed over said photodiode regions.

2. A CCD type solid-state image sensor in accordance with claim 1, wherein each of said photodiode regions is constituted by a relatively low concentration photodiode, a middle concentration photodiode, and a relatively high concentration photodiode such that it has a concentration distribution in which the impurity concentration is gradually reduced away from each corresponding one of said VCCD channel regions.

3. A CCD type solid-state image sensor in accordance with claim 2, wherein each of said photodiode regions has a junction depth of about 1.5 μm to about 3.5 μm.

4. A CCD type solid-state image sensor in accordance with claim 1, wherein each of said second wells has a junction depth of about 1.0 μm to 1.5 μm.

5. A CCD type solid-state image sensor in accordance with claim 1, wherein each of said transfer gate channel regions has an impurity ion concentration lower than that of each corresponding one of said second wells.

6. A CCD type solid-state image sensor in accordance with claim 1, wherein said thin insulating film is comprised of an oxide film or a nitride film.

7. A CCD type solid-state image sensor in accordance with claim 1, wherein the second conductivity type is a p-type.

8. A CCD type solid-state image sensor comprising:
a silicon substrate of a first conductivity type;
a first well of a second conductivity type formed over said silicon substrate;
a plurality of photodiode regions deeply and widely formed in said first well to be uniformly spaced from one another;
a plurality of second wells of the second conductivity type formed in said first well, each of said second wells being overlapped with each corresponding one of said photodiode regions and one of said photodiode regions preceding to said corresponding photodiode region;
a plurality of vertical CCD channel regions of the first conductivity type respectively formed in said second wells;

a plurality of transfer gate channel regions of the second conductivity type, each formed in each one of said second wells between each photodiode region and each corresponding VCCD channel region;

a plurality of channel stop regions of the second conductivity type respectively formed in said second wells, each of said channel stop regions being adapted to isolate each corresponding VCCD channel region from each corresponding preceding photodiode region;

a plurality of impurity regions of the second conductivity type respectively formed beneath surfaces of said photodiode regions;

a thin insulating film formed over the entire exposed surface of the resulting structure;

a plurality of transfer gates formed on said thin insulating film to be respectively disposed over said second wells;

an interlayer insulating film formed on said thin insulating film to cover said transfer gate electrodes; and a photoshield film formed over the entire exposed surface of the resulting structure except for portions respectively disposed over said photodiode regions;

wherein each of said photodiode regions is constituted by a relatively low concentration photodiode, a middle concentration photodiode, and a relatively high concentration photodiode such that it has a concentration distribution in which the impurity concentration is gradually reduced away from each corresponding one of said VCCD channel regions.

9. A CCD type solid-state image sensor in accordance with claim 8, wherein each of said photodiode regions has a junction depth of about 1.5 μm to about 3.5 μm.

10. A CCD type solid-state image sensor comprising:
a silicon substrate of a first conductivity type;
a first well of a second conductivity type formed over said silicon substrate;
a plurality of photodiode regions deeply and widely formed in said first well to be uniformly spaced from one another;
a plurality of second wells of the second conductivity type formed in said first well, each of said second wells being overlapped with each corresponding one of said photodiode regions and one of said photodiode regions preceding to said corresponding photodiode region;
a plurality of vertical CCD channel regions of the first conductivity type respectively formed in said second wells;
a plurality of transfer gate channel regions of the second conductivity type, each formed in each one of said second wells between each photodiode region and each corresponding VCCD channel region;
a plurality of channel stop regions of the second conductivity type respectively formed in said second wells, each of said channel stop regions being adapted to isolate each corresponding VCCD channel region from each corresponding preceding photodiode region;
a plurality of impurity regions of the second conductivity type respectively formed beneath surfaces of said photodiode regions;

a thin insulating film formed over the entire exposed surface of the resulting structure;

a plurality of transfer gates formed on said thin insulating film to be respectively disposed over said second wells;

an interlayer insulating film formed on said thin insulating film to cover said transfer gate electrodes; and a photoshield film formed over the entire exposed surface of the resulting structure except for portions respectively disposed over said photodiode regions;

wherein each of said second wells is an impurity region having a concentration higher than that of each corresponding one of said photodiode regions.

11. A CCD type solid-state image sensor comprising:

a silicon substrate of a first conductivity type;

a first well of a second conductivity type formed over said silicon substrate;

a plurality of photodiode regions deeply and widely formed in said first well to be uniformly spaced from one another;

a plurality of second wells of the second conductivity type formed in the first well, each of said second wells being overlapped with each corresponding one of said photodiode regions and one of said photodiode regions preceding to said corresponding photodiode region;

a plurality of vertical CCD channel regions of the first conductivity type respectively formed in said second wells;

a plurality of transfer gate channel regions of the second conductivity type, each formed in each one of said second wells between each photodiode region and each corresponding VCCD channel region;

a plurality of channel stop regions of the second conductivity type respectively formed in said second wells, each of said channel stop regions being adapted to isolate each corresponding VCCD channel region from each corresponding preceding photodiode region;

a plurality of impurity regions of the second conductivity type respectively formed beneath surfaces of said photodiode regions;

a thin insulating film formed over the entire exposed surface of the resulting structure;

a plurality of transfer gates formed on said thin insulating film to be respectively disposed over said second wells;

an interlayer insulating film formed on said thin insulating film to cover said transfer gate electrodes; and a photoshield film formed over the entire exposed surface of the resulting structure except for portions respectively disposed over said photodiode regions;

wherein each of said transfer gate channel regions has an impurity ion concentration lower than that of each corresponding one of said second wells.

* * * * *